US005776661A

United States Patent [19]
Casaletto et al.

[11] Patent Number: 5,776,661
[45] Date of Patent: Jul. 7, 1998

[54] PROCESS FOR IMAGING OF LIQUID PHOTOPOLYMER PRINTING PLATES

[75] Inventors: Nicola Casaletto; Wayne M. Gibbons; Joseph F. Rach, all of New Castle County, Del.

[73] Assignee: MacDermid Imaging Technology, Inc., Wilmington, Del.

[21] Appl. No.: 295,326

[22] Filed: Aug. 24, 1994

[51] Int. Cl.⁶ ................................................ G03F 7/00
[52] U.S. Cl. ................................. 430/306; 430/273.1
[58] Field of Search .................................. 430/306, 273

[56] References Cited

U.S. PATENT DOCUMENTS

| | | | |
|---|---|---|---|
| 3,858,510 | 1/1975 | Kai et al. | 101/395 |
| 3,960,572 | 6/1976 | Ibata et al. | 96/115 |
| 4,006,024 | 2/1977 | Ibata et al. | 96/115 |
| 4,056,423 | 11/1977 | Hughes | 156/356 |
| 4,070,110 | 1/1978 | Ott | 355/100 |
| 4,137,081 | 1/1979 | Pohl | 96/87 |
| 4,168,173 | 9/1979 | Pohl | 96/115 |
| 4,174,218 | 11/1979 | Pohl | 430/306 |
| 4,198,238 | 4/1980 | Scheve | 430/286 |
| 4,247,576 | 1/1981 | Kutner | 427/40 |
| 4,266,007 | 5/1981 | Hughes et al. | 430/306 |
| 4,332,873 | 6/1982 | Hughes et al. | 430/15 |
| 4,383,759 | 5/1983 | Bloothoofd et al. | 355/85 |
| 4,403,566 | 9/1983 | Bloothoofd | 118/407 |
| 4,415,654 | 11/1983 | Pohl | 430/328 |
| 4,442,302 | 4/1984 | Pohl | 204/159.23 |
| 4,450,226 | 5/1984 | Bloothoofd | 430/300 |
| 4,475,810 | 10/1984 | Schroeder | 355/85 |
| 4,518,677 | 5/1985 | Pohl | 430/306 |
| 4,638,758 | 1/1987 | Bloothoofd | 118/412 |
| 4,716,094 | 12/1987 | Minonishi et al. | 430/284 |
| 4,816,379 | 3/1989 | Bronstert et al. | 430/306 |
| 4,897,327 | 1/1990 | Dubin et al. | 430/45 |
| 4,960,660 | 10/1990 | Dubin et al. | 430/49 |
| 5,288,571 | 2/1994 | Nakamura et al. | 430/18 |
| 5,348,605 | 9/1994 | Hughes et al. | 156/275.5 |

OTHER PUBLICATIONS

Merigraph® systems for the Printing Industry. Type 3040. Exposure Unit, 10–86, pp. 31–36.

*Primary Examiner*—George F. Lesmes
*Assistant Examiner*—Laura Weiner
*Attorney, Agent, or Firm*—John L. Cordani

[57] ABSTRACT

A method for curing a photosensitive resin composition includes use of an especially thin gauge protective cover film, preferably incorporating a coating to permit ease of removal after imaging. The method also uses a photosensitive resin composition incorporating a photospeed modified capping layer to selectively retard image growth during exposure. To eliminate undesirable defects in the cured photopolymer, a glass plate which had previously contacted and flattened the composition, is separated from the composition by at least 0.025 inches after partially curing the composition but prior to completely curing the composition. The partial cure of the composition is achieved by directing light to the composition from a source of actinic radiation positioned about 6 to 30 inches from the resin composition, where the actinic radiation has a wavelength of maximum intensity of about 365 to about 375 nm.

13 Claims, 2 Drawing Sheets

PROCESS FOR IMAGING OF LIQUID PHOTOPOLYMER PRINTING PLATES

FIELD OF THE INVENTION

This invention relates to an improved method for direct imaging of photopolymer printing plates. More particularly, this invention relates to incorporating several device and process improvements into the usual method of manufacturing liquid photopolymer plates to thereby produce photopolymer printing plates having reduced imaged size dimensions in positive printing elements and increased size dimensions in reverses.

BACKGROUND OF THE INVENTION

In flexographic printing, also known as relief printing, ink is transferred from a pool of ink to a substrate by way of a printing plate. The surface of the plate is shaped so that the image to be printed appears in relief, in the same way that rubber stamps are cut so as to have the printed image appear in relief on the surface of the rubber. Typically, the plate is mounted on a cylinder, and the cylinder rotates at high speed such that the raised surface of the printing plate contacts a pool of ink, is slightly wetted by the ink, then exits the ink pool and contacts a substrate web, thereby transferring ink from the raised surface of the plate to the substrate to form a printed substrate.

Flexographic printing competes with other forms of printing, e.g., lithography, gravure and letterpress printing. Those involved in the flexographic printing industry are constantly striving to improve the flexographic printing process in order to more effectively compete with other printing methods. One area which has received much attention from researchers is the development of improved plates for flexographic printing.

In the early days of flexographic printing, a rubber printing plate was produced by direct engraving on a rubber plate. Another early mode of preparing flexographic plates was first producing an original engraved plate by etching of a metallic plate, then forming a plastic matrix in the form of the metallic plate, followed by pouring rubber into the matrix plate and vulcanizing the rubber. These methods for preparing what may be termed a conventional printing plate, are complex and require considerable expertise to provide a satisfactory product. Since these manufacturing processes require many steps, they are expensive and very time-consuming.

In order to overcome the shortcomings of conventional plates, there has recently been proposed a method of producing a flexographic printing plate from a photosensitive, also known as photopolymerizable or photocurable or photoimageable, resin composition. These so-called photopolymer plates are rapidly coming into general use in various fields of printing because of their better handleability, higher productivity, lower price, and improved printing performance as compared with a conventional printing plate.

Photopolymerizable resin compositions generally comprise an elastomeric binder, herein sometimes referred to as a prepolymer, at least one photopolymerizable monomer and a photoinitiator. To prepare the plates, there is generally formed a photopolymerizable layer interposed between a supporting substrate and one or more cover sheets that may include slip and release films to protect the photosensitive surface. The photosensitive surface is exposed to actinic radiation in an imagewise fashion, i.e., through a transparency bearing the image which it is desired to reproduce, also known as a mask. Upon imagewise exposure to actinic radiation, polymerization, and hence, insolubilization of the photopolymerizable layer occurs in the exposed areas.

Treatment with a suitable developer removes the unexposed areas of the photopolymerizable layer leaving a printing relief which can be used for flexographic printing. The unexposed areas may be removed via an air knife and blotting process, via a solvent which dissolves the unexposed polymer, or via an aqueous system which forms an emulsion with the unexposed polymer.

Imaging on large equipment is typically done with an array of fluorescent bulbs emitting actinic radiation. The fluorescent bulbs provide a diffuse light source that enable the creation of good sidewall structure to relief printing elements. Sturdy sidewall structure is necessary in order for the relief printing plate to maintain its integrity under the forces incurred during printing. However, this process also results in image spreading as the light passing through the mask and protective film provides photopolymer plates having relief elements either larger or smaller than the elements in mask.

On smaller equipment, a single light source can be used, with concomitantly less undesirable image growth. However, the power output and distance required to image large plates (e.g., 44"×60" or greater) with a single light source make this approach undesirable for most commercial operations. At acceptable distances relative to acceptable UV radiation levels to effect reasonable cure times, images in the center of the exposure area will have good uniform sidewall structure but images on the peripheral areas are angled towards the center of the exposure area. Collimation of a plurality of single light sources such as a bank of fluorescent bulbs using, for example, various honeycomb grid devices, results in improved imaging characteristics but significantly increases exposure times beyond commercial acceptability. Additionally, this approach yields a significant loss in sidewall structure necessary for the flexographic printing process.

In the case of relief printing plates made from photosensitive polymeric compositions, the positive printing elements are typically slightly larger than the negative transparency used and the reverses are slightly filled in. This is especially the case with the use of liquid photopolymer compositions where the transparency must be protected from the liquid resin by use of a cover film. Thus, there is a need in the art for a curing process which reproduces the mask image with higher fidelity than can currently be obtained on a commercial scale, i.e., exaggerates neither the negative or positive features of the mask during transfer of the image to the photopolymer composition, and yet still provides sturdy side-walls for the relief elements of the printing plate. The curing process preferably provides the desirable improvements in fidelity without significantly hurting the production rate of the plates.

SUMMARY OF THE INVENTION

Methodology has been found which allows photopolymer printing plates to be imaged so as to reduce the size of small positive images while opening the reverse areas, thus significantly extending the tonal range capability of the plate. This result is achieved by one or more of a variety of techniques which include: use of a thinner gauge protective cover film, incorporating a coating to permit ease of removal after imaging; the use of a photospeed modified capping layer to selectively retard image growth during exposure; use of a more specific wavelength source for actinic radiation; extending the distance between the imaging lamps and the photopolymerizable material; and the incorporation of a lid raising mechanism in the processing equipment to remove pressure on the liquid material during the main exposure.

The present invention provides a method for preparing a photopolymer printing plate comprising placing a photopolymerizable resin composition between a transparent substrate film and a cover sheet formed of a polymeric film. The composition is then exposed to a source of actinic radiation through a negative to provide a partially cured composition having exposed and unexposed regions. The negative is formed of transparent and opaque regions in an image to be transferred to the printing plate. After exposure, the composition in the unexposed regions is removed, to provide the printing plate. Preferably, according to one embodiment of this invention, the cover sheet is substantially transparent to actinic radiation and has a thickness of less than about 0.65 mil, preferably about 0.30 mil to about 0.60 mil.

In another preferred embodiment of the invention, a printing plate is prepared by exposing a photopolymerizable composition to a source of actinic radiation where the composition and source of radiation are separated by a distance of about 6 to about 30 inches, preferably about 15 to about 25 inches, more preferably about 20 inches, and the source of radiation radiates UV light having a wavelength of maximum intensity at about 365 to about 375 nm.

In another preferred embodiment of the invention, a printing plate is prepared from a photopolymerizable composition having a capping layer. A layered photopolymerizable plate of this invention is made by doctoring a first layer of a first liquid photopolymerizable composition at a thickness of 2 to 20 mil or more preferably 5 to 10 mil over a polymeric film (e.g., polypropylene) covering a photographic negative supported by a first sheet of glass. A second layer of a second liquid photopolymerizable composition is then doctored over the first layer at an appropriate thickness to manufacture the required thickness plate. The first liquid photopolymerizable composition has an induction time as measured by photo differential calorimetry of five to ten times that of a second layer of liquid photopolymerizable composition. The photopolymerizable compositions are covered with a suitable support, e.g. a sheet of polyester 1 to 14 mil thick, preferably 4 to 7 mil thick, which may contain an adhesive. A second sheet of glass is placed on top of the substrate, with a second source of actinic radiation positioned in order to transmit actinic radiation through said second glass sheet and said transparent substrate onto said composition. A vacuum is formed between said substrate film and said second sheet of glass. Then said composition is exposed to actinic radiation from said second source followed by replacing said vacuum with a gas at a pressure equal to or greater than atmospheric pressure. The second sheet of glass is then lifted off of the substrate, by a distance of at least about 0.025 inches, preferably about 0.125 inch. Then the composition is exposed to actinic radiation from said first source of actinic radiation. The composition adjacent to the cover sheet preferably has an induction time of greater than 8 seconds, preferably 10 seconds, more preferably 14 seconds.

BRIEF DESCRIPTION OF THE DRAWINGS

The foregoing summary, as well as the following detailed description of the preferred embodiments of the invention, will be better understood when read in conjunction with the appended drawing. For the purpose of illustrating the invention, there is shown in the drawing an embodiment which is presently preferred. It should be understood, however, that the invention is not limited to the precise arrangements and instrumentalities shown. In the drawing.

DETAILED DESCRIPTION OF THE PREFERRED EMBODIMENTS

The process of this invention can be used with any relief printing plate system using actinic radiation to form the images. Typically, the process would involve imaging of liquid photopolymerizable compositions. In order to better illustrate the invention, a typical curing process for a photosensitive resin composition will be described with reference to FIG. 1

Figure 1:
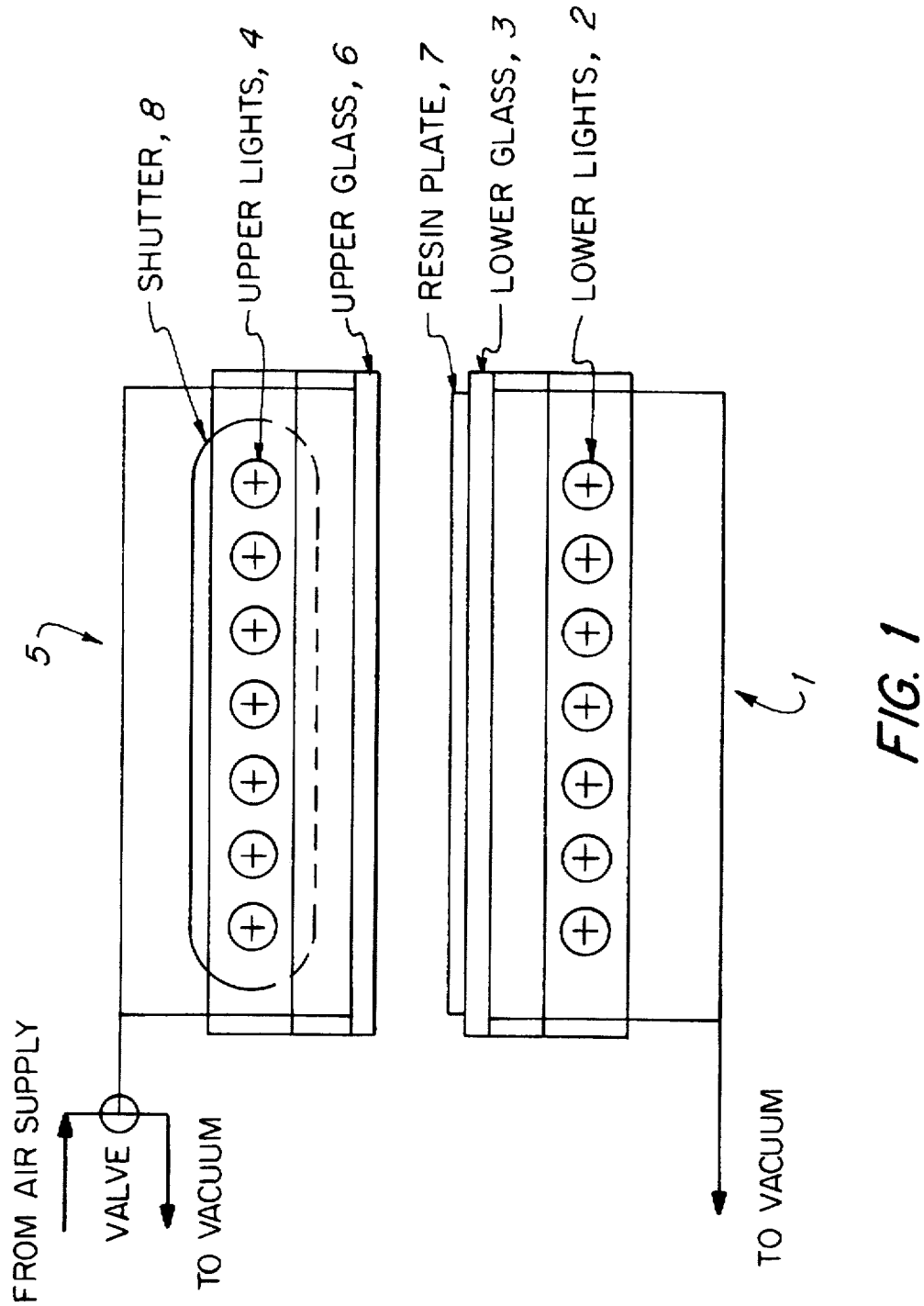
FIG. 1 is a highly simplified, schematic diagram of a conventional exposure unit according to the invention, useful in directing actinic radiation onto and into, and thereby curing, a photosensitive resin composition.

FIG. 1 illustrates essential components of an exposure unit, which in operation is able to cure a liquid photosensitive resin composition so as to form a solid photopolymer plate. FIG. 1 shows a base 1 in which is embedded a lower light source 2. During operation, the light source 2 produces actinic radiation that shines through a lower glass plate 3. The lower glass plate 3 forms the top of the base 1, and has typical side dimensions of 30 inches by 48 inches, or 44 inches by 60 inches, or 52 inches by 80 inches, for example.

The exposure unit illustrated in FIG. 1 also contains an upper bank of lights, 4, housed within a movable case, also known as a lid, 5. The bottom of the case 5 is formed of a sheet of upper glass 6, through which actinic radiation produced by the lights 4 may be transmitted. The sheet of upper glass 6 typically has the width and length as the sheet of lower glass 3. The case 5 is movable in that it can be lowered so that the upper glass 6 can be brought into contact with the lower glass 3, or raised to provide a gap of several feet.

To begin the process of producing a photopolymer printing plate, also known as curing, a negative, not shown, is placed on the lower glass 3. The negative is formed of transparent and opaque regions, in the image ultimately to be printed onto a substrate, e.g., paper. On top of the negative is placed a cover film, which is typically a thin sheet of plastic. A vacuum is then applied between the cover sheet and the lower glass 3, so that the negative and cover sheet are held firmly in place, without air gaps between the cover sheet and the lower glass. The lower glass 3 is typically ground to provide a matte finish, thus enabling a secure vacuum hold down of the film and enhancing diffusion of the light from the source 2.

A photosensitive resin composition 7 is layered across the cover sheet by means of a carriage, also known as a manifold, not shown. Optionally, a second or further layers of photosensitive resin composition are layered across the first layer. After laying down one or more controlled thicknesses of photosensitive resin composition(s), the carriage lays down a substrate film, also known as a backing film, e.g., polyester film, which completely covers the photosensitive resin composition(s).

The case 5 is lowered until the upper glass 7 rests on spacers (not shown) which line the sides of the lower glass plate. A vacuum is then applied between the upper glass and the substrate film, in order to ensure that the substrate film is held tightly against the upper glass, and to ensure that photosensitive resin moves into any small areas where there is a resin shortage. It is critical to the successful manufacture of a photopolymer plate that the thickness of the resin coating be controlled within thousandths of an inch. The use of vacuum helps ensure that constant thickness.

To expose the resin, the upper lights 4 are turned on in order to radiate actinic radiation onto and into the resin plate 7 for an exposure period of time T1. After the time T1, a shutter 8 within the case 5 is made to move between the upper lights 4 and the upper glass 6, and the upper lights are turned off. Then the lower lights 2 are activated and radiate actinic radiation onto and into the resin plate 7 for an exposure period of time T2. The purpose of placing the shutter 8 between lights 4 and glass plate 6 during the period T2 is to prevent reflection of the actinic radiation emitted from the lower lights 2.

After time T2, the lower lights 2 are turned off, and the vacuum maintained between the upper glass 6 and the substrate is broken by allowing air to come between the glass 6 and the substrate. With the vacuum removed, the case 5 can be raised without pulling up the resin plate 7. After the case 5 has been raised, the resin plate 7 is removed and subjected to developing.

One aspect of the inventive method is the use of a reduced thickness film to function as the cover sheet during curing of the photopolymerizable resin composition, where preferred photoimageable materials are those described in U.S. Pat. Nos.: 3,858,510; 3,960,572; 4,006,024; 4,137,081; 4,168,173; 4,716,094; 4,442,302 and 5,288,571, which are incorporated by reference herein. During a typical curing operation, a 0.75 mil to 1.25 mil protective layer is placed over the photosensitive resin composition during imaging, where the layer serves to protect the photographic transparency from the liquid resin. One mil is equal to 0.001 inch, and 0.75 mil is equivalent to 75 gauge.

Figure 2:
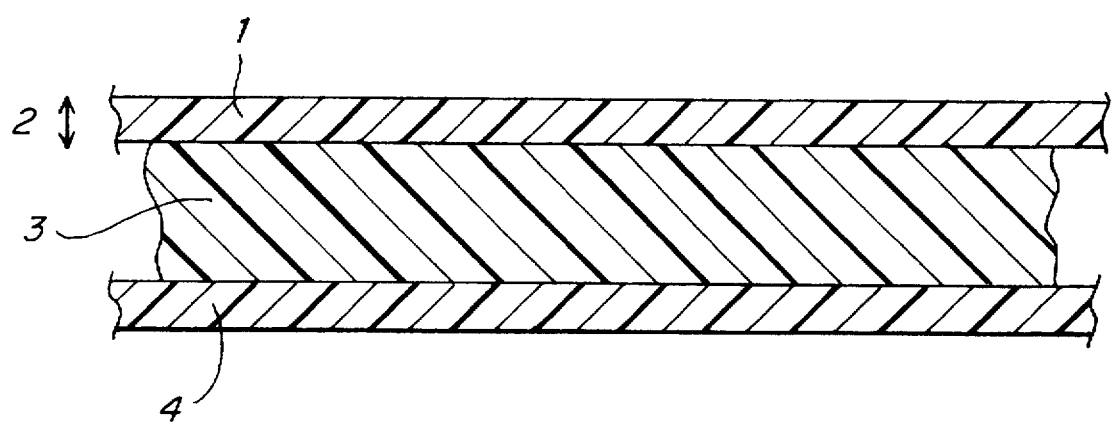
FIG. 2 is a schematic diagram of a photopolymerizable composition between a cover film and a substrate.

FIG. 2 illustrates a photopolymerizable resin 3 sandwiched between a cover sheet, also known as a protective film, 1 and a substrate 4. The cover sheet 1 has a thickness 2.

It has been surprisingly found that there is a correlation between the thickness of the protective film and the topography of the photosensitive resin composition cured through a photographic transparency. By using a thinner gauge film, effects of image broadening due to the space created by the film between the photopolymerizable resin composition and the photographic negative are significantly reduced. When using a diffuse light source, matte finished glass and/or matte finished negatives, presence of a film between the negative and the photopolymerizable composition can cause slight image growth between the photographic negative and the finished plate. This image enlargement is effected by the thickness of the film and the length of exposure time. By using the thinner gauge cover film, the effects due to the "spacer" created by the cover film are significantly reduced. This image broadening is similar to a technique used in duplicating film art referred to as a "spread".

According to the present invention, the cover film has a thickness of about 0.65 mil or less, preferably about 0.32 to about 0.60 mil. Preferably the cover film has a thickness of about 0.45 to about 0.55 mil, and more preferably has a thickness of about 0.48. The cover film is preferably formed from polypropylene, where virgin rather than recycle polymer is preferred because of reduced gel formation in the film. However, other types of ultraviolet transparent films may be employed in this invention including acetate, polyester or coextruded polypropylene films. The preferred film is electrical capacitor grade polypropylene (EK500 manufactured by Applied Extrusion Technologies, Inc. (AET), Salem, Mass.).

The thin cover film of the invention is preferably coated to provide good release properties from the photopolymeric composition after imaging. The use of a surfactant in the coating solution provides good wetting of the film by the coating solution, and reduces adhesion of the coating to the film. Thus, when the film is peeled off the exposed plate, film removal from the plate surface is greatly facilitated. A typical coating is described in U.S. Pat. No. 4,247,576, the entire disclosure of which is incorporated herein by reference.

According to another aspect of the invention, the distance between the source of actinic radiation and the resin plate, and quality of the actinic radiation, are controlled within specified limits. During a typical curing process, the source of actinic radiation, shown as 2 is FIG. 1, is held 2.5 inches from the photopolymer resin composition, and the actinic radiation has a maximum intensity at 355 nm. The source of actinic radiation may be referred to herein as a lamp or a light source.

It has been surprisingly found that there is a correlation between the topography of a cured photosensitive resin composition and the character of the actinic radiation which causes the photopolymerizable composition to cure. More specifically, it has been found that by increasing the distance between the source of actinic radiation and the photosensitive resin plate, in conjunction with using a higher or more efficient uv lamp and providing a means for assuring a proper uniformity of light to the image area, there is observed an improvement in the quality of the cured photopolymer resin composition.

According to the present invention, the distance between the source of actinic radiation and the photosensitive resin plate is about 6 inches to about 30 inches. In a preferred embodiment, the distance is about 20 inches.

Because UV light intensity is proportional to the distance through which the light travels, an increase in the distance between the light source and the photoresin plate will result in a less intense light reaching the photoresin plate, which means that the curing time will need to be prolonged in order to obtain the same degree of cure. Since it is commercially undesirable to increase the cure time, a higher intensity light is provided according to the invention.

Thus, according to the present invention, the wavelength of maximum intensity of the source of actinic radiation is preferably raised to about 365 to 375, preferably about 367 to about 373 nm, more preferably about 369 nm. Preferably, the lamp is a fluorescent black light (model F1499T12/BL9/HO/BP, available from Light Source Industries, Ansonia, Conn.), or its equivalent. This bulb provides a narrow ultraviolet output band which more closely matches the ultraviolet absorbance curve of the preferred photoimageable materials of the instant invention.

Examples of suitable sources of actinic radiation are sunlight, commercial UV fluorescent tubes, medium pressure, high pressure and low pressure mercury lamps, superactinic fluorescent tubes, pulsed xenon lamps, lamps doped with metal iodides and carbon arc lamps. Preferably, the photopolymer plates used in the present invention are cured with ultraviolet rays having a wavelength of maximum intensity of about 365 to 375 nm, more preferably 367 to 373 nm, still more preferably 369 nm, which are generated by a low-pressure mercury lamp, high-pressure mercury lamp, carbon arc lamp, ultraviolet fluorescent lamp, chemical lamp, xenon lamp, or zirconium lamp.

To improve uniformity of light to the image area, a reflector shield is preferably installed below the first sheet of glass. Preferably, the reflector shield is made from aluminum, is about eight inches in width, and is positioned immediately below the perimeter of the first sheet of glass. The preferred reflector shield is made from polished aluminum such as Coilzak available from Reynolds Aluminum, Inc.

According to another aspect of the invention, a capping layer having a long induction time is part of the photosensitive resin composition, and said photosensitive resin composition is cured by a modification of the lid raising protocol described with reference to FIG. 1.

Induction time as used herein is defined as a measure of the delay time between exposure to incident radiation energy and photopolymerization. This is typically measured using photo differential scanning calorimetry (photo DSC). In this procedure, a sample is irradiated with appropriate UV light, and the resultant exotherm is monitored. The exotherm is the result of the photopolymerization process release of energy. The induction time is measured as the length of time required to observe a rise in heat energy. The induction time of the cap layer is significantly longer than the base resin, typically five to ten times longer.

U.S. Pat. Nos. 4,266,007 and 4,332,873 describe multilayer photopolymer printing plates having a capping layer. These plates result from the exposure to actinic radiation of two layers of photosensitive resin composition, where the layers are contiguous and sandwiched between a backing sheet, e.g., 4 mil thick polyester (Mylar film, available from E. I. duPont de Nemours & Company, Inc., Wilmington, Del.), and a cover sheet, e.g., 0.75 mil thick polypropylene. Due to compositional differences, the two layers of photosensitive resin respond to actinic radiation to produce cured compositions of nonequal properties. For example, the layer closest to the cover sheet, hereinafter "the capping layer" or "the upper layer", may upon curing, have a Shore D hardness of 50 and a modulus of 53,000 lbs./in.$^2$. The layer closest to the backing sheet, hereinafter "the base layer" or "the underlayer", may upon curing, have a Shore A hardness of 67 and a modulus of 1300 lb./in.$^2$. The entire disclosures of U.S. Pat. Nos. 4,266,007 and 4,332,873 are incorporated herein by reference.

Means to prepare multi-layer photopolymer plates are described in U.S. Pat. Nos. 4,638,758 and 4,383,759 (which are incorporated by reference), where the entire disclosures of these two U.S. patents are incorporated herein by reference.

It is well recognized from photopolymerization theory that the rate at which the liquid photopolymer resins used in this invention will polymerize will depend on the initiator level and type, the inhibitor level and type, the ultraviolet absorber level and type and the overall resin layer thickness. (See G. Odian, Principles of Polymerization. McGraw Hill Book Co., New York, N.Y., 1970, p. 183)

The photopolymerization rate also depends on the reactivity and absorption spectrum of the resin, and correspondingly the spectral energy distribution and intensity level of the radiation source used for exposure. A reduction in shoulder formation in the upper layer (giving a high shoulder angle) is aided by absorbing less divergent or stray radiation in the areas adjacent to the image areas and by use of a resin which reacts more slowly to such divergent radiation. Such lower light absorption is achieved by using a lower concentration of photoinitiator or other light absorber in the upper resin layer. For the same reason a higher level of photoinitiator or other light absorber in the lower resin layer will result in utilization of divergent light which comes through (is not absorbed by) the upper resin or is reflected from the support sheet to cause formation of insoluble polymer over a broader area than that of the image opening (thus giving a lower shoulder angle). It should, therefore, be stressed that, in this invention, the induction time (i.e., the time delay after exposure to incident radiation before polymerization) of the upper resin is slower relative to the underlayer resin.

Acceptable initiators include benzoin; alpha-hydroxymethyl benzoin; 2,2-diethoxyacetophenone; haloalkylbenzophenones; alpha, alpha, alpha-trichloroacetophenone; ketosulfides; 2-alkoxy-1,3-diphenyl-1,3-propanedicne; alkyl benzoin ethers; alpha, alpha-dimethoxyphenylacetophenone; 1-phenyl-1,2-propanedione-2,0-benzyl-oxime; S,S'-diphenylthiocarbonate; and the like. The alkyl benzoin ethers and alpha, alpha-dimethoxyphenylacetophenone are preferred initiators. Ultraviolet absorbers or dyes include acetophenone, benzophenone, thioxanthone, anthraquinone, fluorenone, benzotriazole, o-nitroaniline, and the like. Preferred ultraviolet absorbers or dyes are benzophenone and o-nitroaniline.

Thus, concurrent with the above compositional modifications used to achieve the desired moduli, the level of initiator, inhibitor, and/or ultraviolet absorber should be adjusted so that the upper resin layer (whether harder or softer than the underlayer) has a slower induction time relative to the resin used as the underlayer. The response to ultraviolet radiation of the resin used as the underlayer can be about 1.5 to about 250 times that of the resin used as the upper layer, preferably about 5 to about 20 times that of the upper layer resin. The preferred manner of adjusting photospeed is by preadjusting the initiator level in the resin used for each layer. For initiators such as alkyl benzoin ethers or alpha, alpha-dimethoxyphenylacetophenone about 0.1% to about 1% by weight may be used in the upper (i.e. printing) layer and about 0.5% initiator may be used in the upper layer and about 0.8% to about 1.5% in the underlayer.

To further add to this invention, the use of a multilayer plate is desirable to enhance print quality, as described in U.S. Pat. Nos. 4,266,007 and 4,332,873, which are incorporated by reference. In this invention, it was discovered that further enhancements in imaging could be obtained by the combination of processes described above and the use of a top layer whose inhibition to cure was increased over that of the materials used in the art. Increasing induction time from 5–10 seconds to 10–15 seconds, as measured via photodifferential scanning calorimetry, provides reduced halftone dot images and permits increased dimensions in reverse elements. The capping layer can be any durometer but is most preferred at 40 to 55 Shore A.

The incorporation of the longer induction time capping layer also results in imaging defects which appear as tear drops or tadpoles after imaging. This phenomena is the result of liquid resin moving during the imaging process. The use of a coated cover film as taught in U.S. Pat. No. 4,247,576, incorporated by reference, reduces the tendency for this defect but proved ineffective as the induction time of the cap resin was increased. To overcome this deficiency, a lid raising mechanism was incorporated into the platemaking equipment and activated after the background exposure was completed. This lid raising device incorporates an air bleed to remove the vacuum prior to raising the lid to maintain plate thickness accuracy. Plates made in this fashion do not demonstrate any defects associated with polymeric material flow.

To satisfactorily overcome the teardrop defects, a modification to the standard lid-raising protocol was developed. Thus, according to the present invention, after the exposure period Ti and the shutter 8 is positioned between the upper lights 4 and the upper glass plate 6, the vacuum between the upper glass plate 6 and the substrate film is broken by forcing an air flow into the formerly evacuated space. This air flow allows for the raising of the case 5 without damage to the underlying resin plate 7. However, the case 5 is raised only about ⅛ inch, and the lower lights 2 are turned on for an exposure period T2. After the exposure time T2, the case 5 rises to permit removal of the resin plate 7 and it subsequent development.

The substrate backing sheet, also known as the support, can be any flexible material which is conventionally used with photosensitive elements used to prepare flexographic printing plates. Examples of suitable substrate materials include polymeric films such as those formed by addition polymers and linear condensation polymers, transparent foams and fabrics. A preferred substrate is a polyester film; particularly preferred is Mylar, available from E. I. du Pont de Nemours & Company, Inc., Wilmington, Del. The substrate typically has a thickness from 2 to 10 mil (0.0051 to 0.025 cm), with a preferred thickness of 3 to 8 mil (0.076 to 0.020 cm).

According to the present invention, two or three of the inventive techniques described above can be used to provide photopolymer printing plates having improved fidelity to the photographic negative.

The following examples are provided to better disclose and teach the preparation of the photosensitive resin compositions and printing plate of the present invention. These examples are for illustrative purpose only, and it must be acknowledged that minor variations and changes can be made without materially affecting the spirit and scope of the invention as recited in the claims that follow.

EXAMPLES

In the Examples, the photopolymerizable resin compositions set forth in TABLES A and B were employed to prepare photopolymer plates according to the inventive method. TABLE A gives compositions for capping resins, i.e., resins which are laid down closest to the negative and form the printing side of the photopolymer plate. TABLE B gives compositions for the base resins, i.e., resin which are laid down on top of the capping resins, and which form the base of the cured photopolymer plate.

The prepolymers used in TABLES A and B were prepared according to methods set forth in U.S. Pat. Nos. 3,960,572; 4,006,024 and 4,716,094, the disclosures of which are incorporated herein by reference. The designations Lp, where is A, B, E, and F, as appears in TABLES A and B in the row providing the amounts of prepolymer used in the photosensitive resin composition, indicate prepolymers that are manufactured by Hercules Incorporated, Wilmington, Del. The compositions are listed by weight percent. Induction times before polymerization, as given in TABLE A, were measured by photo differential calorimetry.

TABLE A

Formulations for Capping Resins

| Ingredient | Formulation 1 | Formulation 2 |
|---|---|---|
| Prepolymer | 38.74 (LpA) | 38.63 (LpA) |
| (Designation) | 38.74 (LpB) | 38.63 (LpB) |
| HPMA | 3.22 | 3.22 |
| LMA | 7.92 | 7.92 |
| PPGMMA | 4.36 | 4.36 |
| TMPTMA | 0.59 | 0.59 |
| TEGDMA | 3.22 | 3.22 |
| DEGDMA | 2.48 | 2.48 |
| DMPAP | 0.10 | 0.194 |
| BIBE | 0.09 | 0.159 |
| Benzophenone | 0.28 | 0.33 |
| BHT | 0.2 | 0.2 |
| TEA | 0.06 | 0.56 |
| Induction Time* | 14s | 9s |

*Measured by photoDSC, given in seconds.
HPMA = 2-Hydroxy propyl methacrylate
LMA = Lauryl methacrylate
DEGDMA = Diethylene glycol dimethacrylate
TEGDMA = Tetraethylene glycol
DMPAP = Dimethoxyphenyl acetophenone
TEA = Triethanolamine
TMPTMA = Trimethylolpropane trimethacrylate
PEMA = Phenoethoxy acrylate
BIBE = Benzoin isobutyl ether
PPGMMA = Polypropylene glycol monomethacrylate

TABLE B

Formulations for Base Resins

| Ingredient | Formulation 1 | Formulation 2 |
|---|---|---|
| Prepolymer (Designation) | 73.78 (LpF) | 74.5 (LpE) |
| HPMA | 0.00 | 0.00 |
| LMA | 9.63 | 8.27 |
| PPGMMA | 10.26 | 7.43 |
| TMPTMA 0.59 | 0.97 | 1.75 |
| TEGDMA | 1.60 | 4.22 |
| DEGDMA | 0.00 | 0.00 |
| BHT | 0.10 | 0.145 |
| TEA | 0.07 | 0.07 |
| Benzophenone | 0.00 | 0.00 |
| DMPAP | 1.45 | 1.33 |
| Myristic acid | 1 | 1 |
| Oleamide | 1 | 1 |
| Dimyristylthiodipropionate | .1 | .1 |

Example 1

Sixty-seven mil plates were manufactured according to the standard procedure for platemaking contained in the manual entitled "Merigraph Systems for the Printing Industry Type 3040 Exposure Unit Manual of Instructions," pages 32–34, dated 10–86, incorporated herein by reference, on an exposure unit (Merigraph® 3048 System available from Hercules Incorporated, Wilmington, Del.) in a statistically designed experiment to evaluate the relative effects of the lamp output (355 nm versus 369 nm), lamp distance (2.25 inches versus 8.75 inches), cover film (48-gauge versus 70-gauge polypropylene, using Formulation 1 on Table A as a capping resin (Merigraph® Systems FC55-1 capping resin available from Hercules Incorporated, Wilmington, Del.) and Formulation 2 on Table 2 as a base resin (Merigraph® Systems F240 base resin available from Hercules Incorporated, Wilmington, Del.). The preferred conditions for the 67-mil plate were a 48-gauge cover film and 369-nm lamps at a 8.75 inch distance, as measured by comparing the image dimension of the plate versus the negative maximizing reverse openings and minimizing relief element dimensions.

Example 2

One hundred twenty-five mil plates were manufactured according to the standard procedure on a Merigraph® 3048 exposure unit in a statistically designed experiment to evaluate the relative effects of the lamp output (355 nm versus 369 nm), lamp distance (2.25 inches versus 8.75 inches), cover film (48-gauge versus 70-gauge), using Formulation 1 on Table A as a capping resin (Merigraph® Systems FC55-1 capping resin available from Hercules Incorporated, Wilmington, Del.) and Formulation 1 on Table B as a base resin (Merigraph® Systems G125 base resin, available from Hercules Incorporated, Wilmington, Del.). The preferred conditions for the 125-mil plate were a 48-gauge cover film and 369-nm lamps at a 8.75 inch distance.

Example 3

Sixty-seven mil plates made as above in Example 1 were compared to plates made on a different exposure unit (Merigraph System 52×80 unit, available from Hercules Incorporated, Wilmington, Del.), with lamps lowered 19 inches. Reproduction results were improved with the lamps in the lowered position. Results are measured with a Nikkon image projector equipped with a micrometer. Plate surface dimensions are compared to the image size in the photographic negative.

Example 4

Sixty-seven mil plates were made on a similar exposure unit as used in Example 3 with Formulation 2 on Table A FC55 Merigraph System capping resin available from Hercules Incorporated, Wilmington, Del., and Formation 1 on Table A as capping resins, with the base resin of Example 1 with lamps located 2.25 inches and 19 inches from the bottom of the lowered glass. Best reproduction was obtained using Formulation 1 on Table A as a capping resin and lamps in the lowered position.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for preparing a photopolymer printing plate comprising the steps of placing a photopolymerizable resin composition between a transparent substrate film and a cover sheet formed of a polymeric film, placing a negative between said cover sheet and a first source of actinic radiation, said negative formed of transparent and opaque regions in an image to be transferred to said plate, supporting said negative on a first sheet of glass placed between said negative said first source of actinic radiation, placing a second sheet of glass on said substrate, positioning a second source of actinic radiation to shine through said second glass sheet and said transparent substrate onto said composition, forming a vacuum between said substrate film and said second sheet of glass, exposing said composition to actinic radiation from said second source followed by replacing said vacuum with a gas at a pressure equal to or greater than atmospheric pressure, separating said second sheet of glass from said substrate by a distance of at least 0.025 inch followed by exposing said composition to actinic radiation from said first source of actinic radiation, wherein said composition adjacent to said cover sheet has an induction time of greater than 8 seconds.

2. The method of claim 1 wherein said second sheet of glass is separated from said substrate by a distance of at least 0.125 inch.

3. The method of claim 1 wherein said cover sheet has a thickness of at least 0.65 mil.

4. The method of claim 1 wherein said cover sheet has a thickness of 0.30 mil to 0.60 mil.

5. The method of claim 1 wherein said composition adjacent to said cover sheet has an induction time of greater than 10 seconds.

6. The method of claim 1 wherein said composition adjacent to said cover sheet has an induction time of greater than 14 seconds.

7. The method of claim 1 wherein a reflector shield is positioned immediately below the first sheet of glass.

8. The method of claim 7 wherein the reflector shield comprises aluminum.

9. The method of claim 1 wherein the reflector shield is eight inches in width.

10. The method of claim 1 wherein said first source of actinic radiation is separated from said composition by a distance of 6 to 30 inches, and radiates UV light having a wavelength of maximum intensity of 365 to 375 nm.

11. The method of claim 10 wherein said cover sheet is transparent to said actinic radiation and has a thickness of 0.30 mil to 0.60 mil, wherein said first source of actinic radiation is separated from said composition by a distance of 6 to 30 inches and radiates UV light having a wavelength of maximum intensity of 365 to 375 nm.

12. The method of claim 11 wherein said cover sheet is polypropylene and has a thickness of 0.48 mil, wherein said first source of actinic radiation radiates UV light having a wavelength of maximum intensity of 369 nm, and wherein said composition adjacent to said cover sheet has an induction time of greater than 14 seconds.

13. The method of claim 12 wherein a reflector shield is positioned immediately below the first sheet of glass, said reflector shield comprising aluminum and is eight inches in width.

* * * * *